United States Patent [19]  
Van Deursen et al.

[11] Patent Number: 4,641,367  
[45] Date of Patent: Feb. 3, 1987

[54] RECEIVER FOR FM SIGNALS WITH TRANSMITTER STATUS CODE STORAGE

[75] Inventors: Theodorus H. M. Van Deursen; Derk J. C. Wassink, both of Eindhoven, Netherlands

[73] Assignee: U.S. Philips Corporation, New York, N.Y.

[21] Appl. No.: 736,518

[22] Filed: May 20, 1985

Related U.S. Application Data

[63] Continuation of Ser. No. 500,721, Jun. 3, 1983, abandoned.

[30] Foreign Application Priority Data

Jun. 15, 1982 [NL] Netherlands ............. 8202416

[51] Int. Cl.[4] ............. H03J 7/18; H04B 1/10
[52] U.S. Cl. ............. 455/161; 455/166; 455/186; 455/194
[58] Field of Search ............. 455/52, 62, 165, 166, 455/184–186, 205, 194

[56] References Cited

U.S. PATENT DOCUMENTS

| | | | |
|---|---|---|---|
| 4,253,194 | 2/1981 | Van Deursen | 455/161 |
| 4,285,066 | 8/1981 | Van Deursen | 455/165 |
| 4,378,604 | 3/1983 | Wassink | 455/161 |
| 4,392,247 | 7/1983 | Van Deursen | 455/161 |
| 4,430,753 | 2/1984 | Shiratani | 455/166 |
| 4,509,203 | 4/1985 | Yamada | 455/166 |

FOREIGN PATENT DOCUMENTS 3034155 3/1982 Fed. Rep. of Germany ...... 455/161

Primary Examiner—Jin F. Ng  
Attorney, Agent, or Firm—Thomas A. Briody; Jack Oisher; William J. Streeter

[57] ABSTRACT

In a receiver for FM-signals, more specifically a car radio, the tuning data for those FM-transmitters which transmit the same program are stored in addressable memory locations of a first memory field. In order to be continuously tuned to the best receivable transmitter a second memory field is provided, which comprises in each of the addressable locations a status code word which is unambiguously associated with a tuning datum. These status code words are produced by a status circuit to which the intermediate-frequency signal is applied. A control circuit starts at regular intervals an up-date cycle during which the receiver is tuned to a number of transmitters whose tuning data are stored in the first memory field. In each tuning action a new status code word is determined to replace the original status code word. Thereafter the new status code words are checked against a predetermined criterion and the receiver is tuned to that transmitter whose associated status code word satisfies that criterion to the highest extent.

6 Claims, 2 Drawing Figures

RECEIVER FOR FM SIGNALS WITH TRANSMITTER STATUS CODE STORAGE

This is a continuation of application Ser. No. 500,721, filed June 3, 1983, now abandoned.

BACKGROUND OF THE INVENTION

Field of the Invention

The invention relates to a receiver, more specifically a radio receiver, arranged for receiving FM-signals. Such signals are transmitted by FM-transmitters and are formed by a carrier signal having a given nominal frequency which is changed in response to an information signal. Hereinafter this information signal will be designated a (radio) program.

Description of the Prior Art

FM-signals have the advantage compared with AM-signals that they are less sensitive to interferences which may cause an amplitude change of the carrier signal. As this carrier signal has a very high frequency, the range of an FM-transmitter is considerably shorter than that of an AM-transmitter. For mobile receivers, such as car radios, this is a particularly unpleasant attendant circumstance. If, namely, one moves outside the service area of the FM-transmitter to which the receiver has been tuned and if one wants to continue to follow the radio program transmitted by the transmitter then the receiver must be manually tuned to a different FM-transmitter (other nominal frequency) transmitting the same radio program. In many countries this is possible, as a network of FM-transmitters is present, all FM-transmitters of this network transmitting the same radio program and this radio program being modulated on a carrier signal whose nominal frequency is characteristic of the relevant FM-transmitter.

In order to avoid the necessity of repeated manual tuning of the receiver if one moves outside the service area of one FM-transmitter and arrives in the service area of an other FM-transmitter transmitting the same radio program, it is proposed in reference 1 (see references paragraph below) to store the tuning data from those FM-transmitters which, for example, transmit the same radio program in an addressable memory field of a memory means. This memory field comprises a plurality of addressable memory locations in each of which such a tuning datum has been stored.

In addition, this prior art receiver comprises a control circuit by means of which a tuning datum can be selected from the addressed memory field and applied to a generator. This generator produces a demodulator signal the frequency of which is determined by the tuning datum. This demodulator signal is applied together with the received FM-signal to a mixer circuit, which produces an intermediate-frequency output signal. This output signal is applied to a level detector producing a level signal whose magnitude is proportional to the amplitude of the intermediate-frequency signal. If this level signal becomes smaller than a first threshold value, then the control circuit applies a different tuning datum to the generator. In response to this tuning datum the level detector produces a new level signal. Should this new level signal exceed a second threshold value than this tuning datum is permanently applied to the generator and the receiver remains tuned to the FM-transmitter corresponding to this tuning datum. Should, however, this new level signal be less than the second threshold value then a different tuning datum is again applied to the generator.

Although this prior art receiver is perfectly satisfactory in practice, it nevertheless has the drawback that when the field strength of the FM-transmitter to which the receiver is tuned becomes lower, the quality of the reproduction decreases and that, more specifically, the noise level increases. To prevent this noise level increase from becoming audible, in the prior art receiver an increasing number of high frequency components of the signal to be reproduced are suppressed as the noise level increases. If this noise level exceeds a predetermined threshold value then the receiver may even be switched over (automatically) from stereo to mono reproduction.

SUMMARY OF THE INVENTION

It is an object of the invention to provide a considerable improvement in the quality of reception in a receiver of the above-described type which comprises:
a mixer circuit to which the received FM-signal and a demodulator signal are applied for generating a mixer circuit output signal (intermediate-frequency signal);
a generator for generating the demodulator signal with a frequency determined by a tuning datum;
a first memory field having a number of addressable memory locations in each of which a tuning datum is stored, each tuning datum characterizing the frequency of the demodulator signal and thus a given transmitter.

According to the invention the receiver further comprises:
a status circuit for producing a status code word and having an input coupled to the output of the mixer circuit;
a second memory field having a number of addressable memory locations in each of which a status code word is stored and wherein a tuning datum is unambiguously associated with each status code word;
a control circuit for;
starting an up-date cycle in which a number of the tuning data are sequentially applied to the generator, in response whereto the status circuit generates for each of these tuning data an associated new status code word and the original status code words associated are replaced by the new status code words
checking the new status code words against a predetermined criterion, selecting that tuning datum whose associated status code word satisfies to the best extent this criterion, and applying that tuning datum to the generator.

The above-mentioned criterion may consist of a number of sub-criteria. This first sub-criterion may, for example, be that the amplitude of the mixer circuit output signal must be above a predetermined threshold value. A second sub-criterion may be that the multi-path distortion must be below a predetermined threshold value, and a third sub-criterion may be that the transmitter to be tuned to must be a transmitter of the class transmitting traffic information etc. The two first mentioned sub-criteria can be interpreted as follows; the receiver is tuned to a different FM-transmitter when the reception thereof is better than that of the FM-transmitter to which the receiver is tuned at the instant that the up-date cycle starts.

By starting the up-date cycle at regular intervals it is accomplished that tuning of the receiver is regularly corrected such that it is continuously tuned to the best receivable transmitter.

REFERENCES

1. Receiver including a tuning circuit having a transmitter search; U.S. Pat. No. 4,253,194.
2. Intelligentes Autoradio, Ein Mikrocomputer wählt Sender; Funkschau, No. 5, 1982, pages 57–60.

DESCRIPTION OF THE PREFERRED EMBODIMENTS

The construction of the receiver

Figure 1:
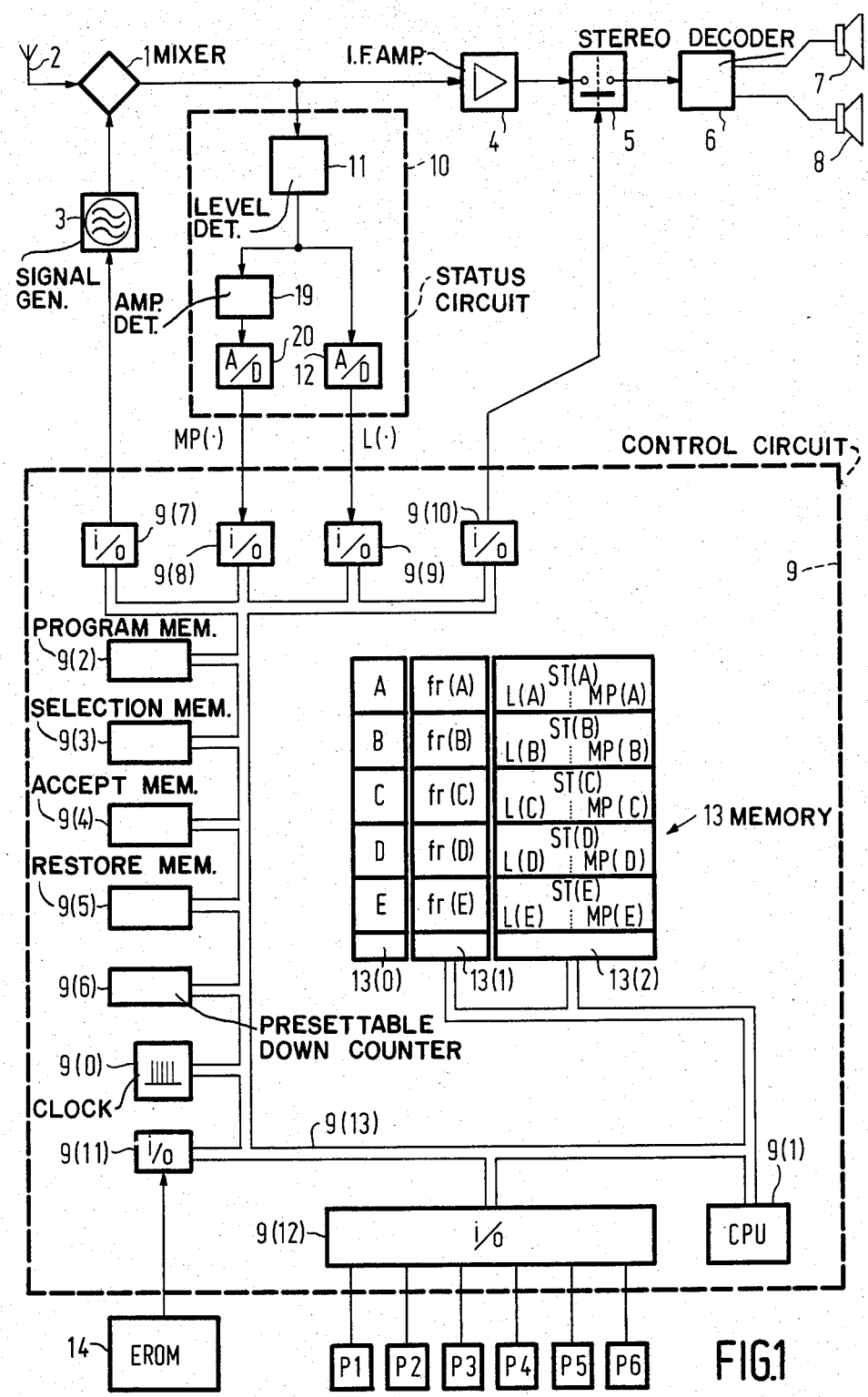
FIG. 1 shows schematically a receiver for FM-signals, according to the invention.

The receiver shown in FIG. 1 comprises a mixer circuit 1 to which there are applied an FM-signal received by an aerial 2 and also a demodulator signal generated by a generator 3. The mixer circuit 1 produces an intermediate-frequency signal having a nominal frequency of, for example, 10.7 MHz. This signal is applied via an intermediate-frequency amplifier 4 and a switch 5 to a stereo decoding circuit 6, which produces the left signal and the right signal of a stereophonic signal. These signals are applied to the loudspeakers 7 and 8, respectively.

The generator 3 is in the form of a synthesizer as described, for example, in Reference 2. As is known, it comprises an adjustable frequency divider. This synthesizer produces a demodulator signal whose frequency is determined by the divirsor of the adjustable frequency divider. This divider is equal to or derived from a tuning datum applied to the generator 3 and produced by a control circuit 9.

Switch 5, which is arranged between the intermediate frequency amplifier 4 and the stereo decoding circuit 6 is controlled by what is commonly referred to as a mute signal which is also produced by the control circuit 9. The signal path to the stereo decoding circuit can be interrupted by means of this switch.

In the embodiment shown, the intermediate-frequency signal is not only applied to the amplifier 4 but also to a status circuit 10, which comprises a level detector 11 of a known construction which produces as its output signal a level signal whose amplitude is proportional to the amplitude of the intermediate-frequency signal and consequently to the field strength of the received FM-signal. This level signal is applied to an analog-to-digital converter 12. Therein, the level signal is subjected to, for example, an 8-level linear quantization and a 3-bit level code word is generated which represents the quantization level of the level signal. In this respect the spacing between two consecutive quantization levels is sometimes called a reference signal or quantization step size, so that the level code word indicates how many integral quantization steps are included in the value of the level signal; or, which is the same, this level code word gives, rounded-off, the ratio between the magnitude of the level signal and the quantization step size. When the receiver is tuned to a transmitter A then a level code word is obtained which will be designated L(A). When the receiver is tuned to a transmitter B, then this level code word will be designated L(B), etc.

The control circuit 9 is arranged for performing a very large number of control functions and is therefore provided by a microcomputer. In the extensively tested construction of this receiver the MOSTEK MK 3870 has been chosen for this purpose. It comprises inter alia a central clock pulse generator 9(0), a CPU (central processing unit) 9(1), a program memory 9(2), a selection memory 9(3), an accept memory 9(4), a restore memory 9(5), a presettable down counter 9(6) to which the clock pulses produced by the central clock pulse generator 9(0) are applied, six i/o gates 9(7), 9(8), 9(9), 9(10), 9(11), 9(12) and a memory means 13. All these elements are intercoupled in known manner by means of a bus system 9(13).

The i/o gate 9(7) supplies the tuning datum which is applied to the generator 3. The level code word L(.) produced by the analog-to-digital converter 12 is applied to the microcomputer via i/o gate 9(9), while the mute signal applied to the switch 5 is supplied by i/o gate 9(10). The i/o gate 9(11) is connected to a memory 14 which comprises, for example, six memory fields which are each addressable. Of, for example, five transmitters transmitting the same program, the associated tuning data are stored in each memory field. These tuning data are, for example, stored in this memory, before the receiver is put into use. This might, for example, be done already in the factory. Six program keys denoted P1, P2, P3, P4, P5 and P6, respectively, which each represent a given program and thus characterize a given memory field in the memory 14 are connected to the i/o-gate 9(12).

The memory means 13 comprises five addressable memory locations denoted in the Figure by A, B, C, D, E. The memory location A contains data about a transmitter A, more specifically the tuning datum fr(A) and a status code word ST(A). Likewise, the memory location B contains data about a transmitter B, more specifically the tuning datum fr(B) and the status code word ST(B), etc. Each memory location is divided into two sub-memory locations. In one of these sub-memory locations the tuning datum fr(.) is stored and in the other one the status code word ST(.). The sub-memory locations in which the tuning data fr(.) have been stored together form a first memory field 13(1) and the sub-memory locations in which the status code words ST(.) are stored together form a second memory field 13(2).

The status code word ST(.) may be divided into one, two or more substatus code words. Hereinafter it will in the first instance be assumed that the status code word ST(.) is provided by the level codeword L(.).

Receiver operation

Figure 2:
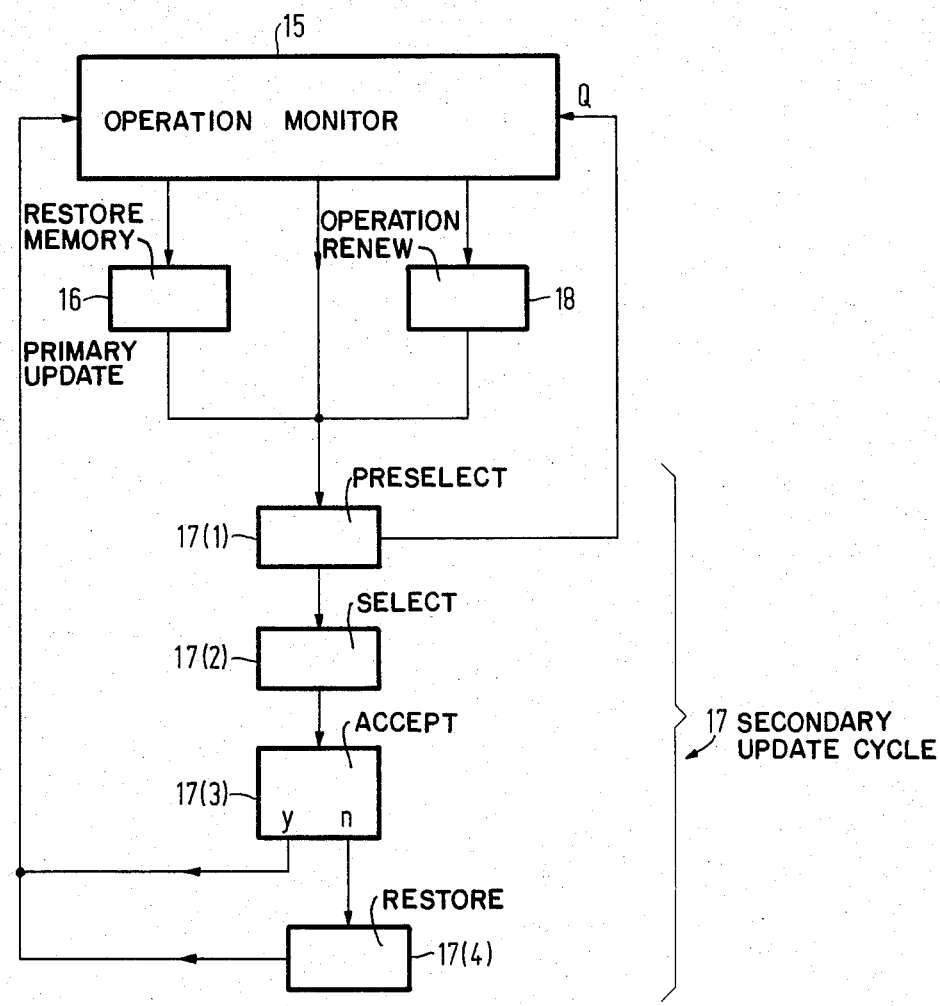
FIG. 2 shows schematically the operation of the receiver shown in FIG. 1.

The mode of operation of the receiver shown in FIG. 1 is schematically shown in FIG. 2. By way of example let it be assumed that the receiver has been tuned to transmitter E. This means that the tuning datum fr(E) is applied to generator 3 via i/o-gate 9(7). This also means that the tuning datum fr(E) and the level code word L(E) are stored in the restore memory 9(5).

The operation of the receiver may inter alia be divided into a number of operations, in a primary up-date cycle, in a secondary up-data cycle, and in a program key cycle. It is monitored by an operation which will be designated an operation monitor.

In FIG. 2 this operation monitor is denoted by reference numeral 15. During this operation it is, for example, checked whether the down-counter 9(6) has reached its zero position; whether a program key has been operated; whether a tuning operation must be effected and if so which tuning datum must be used therefor; at the same time it ensures that tuning is indeed effected; and whether a quantity Q has reached the value five; it also effects starting of one of the above-mentioned cycles.

Let is be assumed that during the operation monitor counter 9(6) reaches its zero position, in response to which a primary up-date cycle is started. This cycle is formed by an operation up-date restore memory and a secondary up-date cycle.

In FIG. 2 this operation up-date restore memory is denoted by reference numeral 16. During this operation a new level code word is determined for the transmitter E whose tuning datum fr(E) and level code word L(E) have been stored in the restore memory 9(5). This will be designated by L'(E). In the restore memory 9(5) this new level code word replaces the original level code word L(E).

After this operation the secondary up-date cycle which, in FIG. 2, is denoted by reference numeral 17 and which is formed by an operation pre-select, an operation select, an operation accept and an operation restore, is then proceeded to.

The operation preselect is shown in FIG. 2 by means of the reference numeral 17(1). During this operation the associated tuning data and level code words of N transmitters are transferred to the selection memory 9(3). In a practically tested receiver the memory means 13 has ten addressable memory locations and the value 3 has been chosen for N, and first those three transmitters are chosen with which the greatest level code words are associated. Let it be assumed that they are the transmitters B, C and E.

The operation select is shown in FIG. 2 by means of the reference numeral 17(2). During this operation, the control circuit 9 produces a mute signal in response to which switch 5 becomes non-conductive. Thereafter the three tuning data fr(B), fr(C), fr(E) selected during the operation preselect are sequentially applied to generator 3 and the new level code words L'(B), L'(C), L'(E) are determined. These data are stored in the memory field 13(2) to replace the original level code words. Then it is determined which of these three new level code words is the greatest. Let it be assumed that this is L'(B), which is then stored together with the associated tuning datum fr(B) in the accept memory 9(4).

The operation accept is shown in FIG. 2 by means of the reference numeral 17(3). During this operation the transmitter B, whose tuning datum fr(B) and level code word L'(B) are stored during the operation select in the accept memory 9(4),is checked against a criterion which may consist of one or more sub-criteria. It is checked in any case whether the tuning datum fr(B) is unequal to the tuning datum fr(E) which at that moment is still contained in the restore memory 9(5). In the affirmative case it can then be checked whether this transmitter E also satisfies the further sub-criteria. If it is found that transmitter B is better in all respects than the transmitter E, then the tuning datum fr(B) and the level code word L'(B) are stored in the restore memory 9(5) and the receiver is thereafter tuned to a transmitter B via the operation monitor. If transmitter B is found not to be better than transmitter E, then the receiver is tuned again to transmitter E, for which use is made of an operation restore which, in FIG. 2, is denoted by reference numeral 17(4). Once it has been determined which transmitter the receiver must be tuned to then this tuning is effected and a de-mute signal is produced in response to which switch 5 becomes coductive again.

As during the above-described up-date cycle no signal is applied to the loudspeakers 7 and 8, the duration of this primary up-date cycle must be very short. In practice it has been found that a cycle duration of approximately 30 msec. is still just acceptable. This time is, however, too short to update the associated level code words of all transmitters stored in the memory 13. Hence, groups of N=3 transmitters are checked in practice. For a proper functioning of this receiver it is necessary that the level code words of all the transmitters are updated as quickly as possible. In order to realize this, it is also counted during the operation preselect 17(1) of how many transmitters the associated level code words have already been updated. This number is represented by the above-mentioned quantity Q. At the end of this operation preselect the down-counter 9(6) is adjusted to a predetermined value via the operation monitor. For the period of time in which the associated level code words of all the transmitters have not yet been updated, this down-counter 9(6) is preset in such a manner that the clock pulse generator 9(0) requires, for example, twelve seconds to count down to the zero position. When this zero position has been reached, then a new secondary up-date cycle is immediately started by the operation monitor. Then, during the operation preselect, three tuning data are again selected from the tuning data whose associated level code words are still to be updated, etc. This secondary up-date cycle is repeated, with twelve seconds intervals, until the level code words of all the transmitters have been updated. If during the operation preselect it has been ascertained that there are now no further transmitters whose associated level code words must be updated, then the down-counter 9(6) is preset in such a manner that it takes 3 to 4 minutes before it has arrived in the zero position again. A new primary up-date cycle is then started.

The program key cycle is started by the operation monitor if a program key, for example P4, is operated. This cycle is formed by an operation renew and the secondary up-date cycle.

The operation renew is denoted in FIG. 2 by the reference numeral 18. During this operation a mute signal is first generated whereby switch 5 is adjusted to a non-conductive state. Thereafter the memory fields 13(1) and 13(2) and also the memories 9(3), 9(4) and 9(5) are cleared. Then the tuning data for the program P4, stored in a memory field of memory 14 are written into the memory 13. All the level code words associated with these tuning data are now still equal to zero. To update them the above-mentioned secondary up-date cycle is now started.

Extending the receiver

In the preceding paragraph it has already been mentioned that to determine which transmitter the receiver is tuned to it need not merely be checked whether the level code word of the new transmitter B is greater than that of the original transmitter E, but that also other sub-criteria may play a part. A fact which has proved to be very valuable in practice is the degree of multi-path distortion transmitter B has relative to transmitter E.

Multi-path distortion is an audible distortion of the received signal. This distortion occurs because of the fact that the FM-signal transmitted by the transmitter which the receiver has been tuned to reaches the receiving aerial from different directions due to reflections from obstacles such as mountains and buildings. They do not only cause a distortion of the FM signal but also result in an amplitude modulation of the FM signal. This amplitude modulation is superimposed on the output signal of the level detector 11, which output signal is in normal circumstances a d.c. voltage signal. The presence of multi-path distortion and possibly also the magnitude thereof can be established in a simple manner by means of an amplitude detector which produces an output signal whose magnitude is proportional to the change in the amplitude of the input signal.

In FIG. 1 the said amplitude detector is denoted by the reference numeral 19. Its input is connected to the output of the level detector 11 and its output is connected to the input of an analog-to-digital converter 20. It produces a code word MP(.) which may consist of one or more bits. The output of this analog-to-digital converter is connected to the bus system 9(13) of the microprocessor 9 via i/o-gate 9(8).

The receiver might operate as follows. Each time during operation select that a tuning datum, for example fr(B), is applied to the generator 3 the analog-to-digital converter 12 does not only produce a new level code word L'(B) but the analog-to-digital converter 20 also produces a new multi-path distortion code word MP'(B). The value thereof indicates whether there is multi-path distortion (in that case a one-bit code word is sufficient) and possibly how large the degree of multi-path distortion is (in that case a multi-bit code word must be used). The code words MP(.) obtained and updated thus now represent, as do also the level code words L(.) a portion of the status code words ST(.) and may be stored in the memory field 13(2). A receiver operating in this manner requires, however, a very fast amplitude detector 19. The required speed is however, too high to determine during the up-date cycle of each transmitter the associated code word MP(.).

As it is nevertheless very useful to have some knowledge of the multi-path distortion evidenced by the transmitter B to which the tuner will tune itself, the receiver is tuned during the operation accept for a sufficiently long period of time to this transmitter B and only the multi-path distortion code word MP(B) associated therewith is determined. If it is found that for this transmitter B it holds that L'(B)>L'(E) and MP'(B)<MP'(E), then it may be decided to tune the receiver to transmitter B. If, however, it is found that it holds for transmitter B that L'(B)>L'(E) but also that MP'(B)>MP'(E) then, since multi-path distortion is a very annoying phenomenon, it may be decided to tune the receiver again to transmitter E, the tuning datum of which is contained in the restore memory 9(5).

Additional remarks

1. In the foregoing a receiver is described in which for each transmitter of a group of transmitter the associated tuning datum is stored in a memory field and in which for each transmitter one or more substatus code words are determined, which are also stored in a memory field. In essence, the number of substatus code words one wants to store per transmitter is of course unlimited. For actual practice, a still very interesting substatus code word is what may be denoted a traffic information code word from which it can be seen whether a given transmitter provides traffic information. This code word, which may consist of one bit, may be derived in customary manner by means of an analog-to-digital converter for a traffic information detector which produces an output signal if the receiver is tuned to a transmitter providing traffic information.

2. In paragraph Receiver operation above it is stated by way of example that the interval between two consecutive secondary up-date cycles may have a duration of approximately 12 seconds. The length of this interval may, however, depend on the cause which rendered it necessary to pass through this secondary up-date cycle. During the program key cycle, for example, this interval may be much shorter.

3. In paragraph extending the receiver above it has already been remarked that if transmitter B appears to have a higher degree of multi-path distortion than transmitter E, while the level code word L'(B) is greater than L'(E), the receiver is then preferably tuned again to transmitter E. In such a situation it is recommended not to wait approximately 3 to 4 minutes before starting a new primary up-date cycle, but to do this much earlier, for example after some seconds only.

What is claimed is:

1. In a receiver for receiving FM signals transmitted by a plurality of FM transmitters transmitting the same program at different carrier frequencies, said receiver having a first memory field having a plurality of addressable memory locations each storing a predetermined fixed tuning datum, each of said tuning datum corresponding to the frequency of one of said carrier frequencies, said receiver further having generator means for generating demodulator signals each having a frequency corresponding to a tuning datum applied to said generator means, and a mixing circuit connected to said generator means for generating mixing circuit output signals in response to received FM signals and said demodulator sigals, said mixing circuit output signals having at least one characteristic indicative of the quality of reception of said program at the carrier frequency corresponding to the so-applied tuning datum, the improvement comprising:

status circuit means having an input coupled to said mixing circuit for producing status code words signifying respective values of said quality-indicative characteristic of said mixer circuit output signals;

a second memory field having a plurality of addressable second memory locations, each storing a status code word associated with a corresponding tuning datum stored in said first memory field; and control circuit means including a programmable processor connected to said status circuit means, first and second memory fields, generator means and mixing circuit for periodically upgrading reception, said control circuit means operable during a SELECT operation at predetermined time intervals for applying at least selected ones of said tuning datum from said first memory field sequentially to said signal generator means for tuning each of a plurality of FM signals, whereby said status circuit means creates a new status code word for each signal tuned in response to so-applied tuning datum, said control circuit means during said SELECT operation replacing said associated status code words in said addressable second memory field locations by said new status code words, said control circuit means selecting from said new status code words the code word signifying the highest value of said quanlity-indicative characteristic, thereby generating an optimum status code word, and said control circuit means applying during an ACCEPT operation the tuning datum associated with said optimum status code word to said generator means subsequent to one of said predetermined time intervals.

2. A receiver as claimed in claim 1, wherein a status code word comprises a multi-path distortion code word, and wherein said status circuit means comprises:

a multi-path distortion detector coupled to said mixing circuit for supplying a multi-path distortion signal having a level depending on the multi-path distortion of the transmitter characterized by the tuning datum; and means for converting said multi-path distortion signal into a multi-path distortion code word.

3. A receiver as claimed in claim 1, wherein said quality indicative characteristic is the level of said mixing circuit output signal; and wherein said status circuit means comprises: a level detector coupled to said mixing circuit for producing a level signal having a magnitude proportional to the amplitude of said mixing circuit output signal, and a linear analog-to-digital converter connected to said level detector for converting said level signal into a level code word signifying said magnitude of said level signal.

4. A receiver as claimed in claim 1, further comprising accept memory means for storing said selected status code word and said tuning datum associated therewith, and restore memory means for storing the tuning datum currently applied to said generator means and the current status code word associated therewith; and wherein said control circuit means compares during a restore operation said selected status code word to said current status code word and stores the tuning datum associated with the one of said so-compared status code words signifying the highest value of said quality indicative characteristic in said restore memory means for application to said generator means throughout said subsequent one of said predetermined time intervals.

5. A receiver as claimed, in claim 4, further comprising at least one loudspeaker connected to said mixing circuit; and wherein said control circuit means disconnects said loudspeaker from said mixing circuit at the start of said upgrading, selects from said addressable second memory locations a multiplicity N of status code words signifying the highest values of said quality indicative characteristic of said mixing circuit output signal and applies said tuning data associated with the so-selected ones of said status code words to said signal generator means thereby creating N new status code words, reconnects said loudspeaker to said mixing circuit following creation of said N new status code words thereby ending a first cycle, and starts a subsequent cycle for N further ones of said status code words after said predetermined time interval.

6. A receiver as claimed in claim 5, wherein said control circuit means further automatically determines new status code words for each additional plurality of n transmitters until every one of said transmitters in said plurality of said transmitters has its status code word updated.

* * * * *